United States Patent [19]

Hung et al.

[11] Patent Number: 5,148,765
[45] Date of Patent: Sep. 22, 1992

[54] PRINTED-WIREBOARD PHOTOIMAGING

[75] Inventors: Paul L. K. Hung, Edison; John Cioffi, Middletown, both of N.J.; Mark L. Lavach, Tatamy, Pa.

[73] Assignee: Elf Atochem North America, Inc., Pa.

[21] Appl. No.: 483,157

[22] Filed: Feb. 22, 1990

[51] Int. Cl.⁵ .................................. B05C 11/02
[52] U.S. Cl. .................................. 118/100; 118/106; 118/642; 427/369; 430/313
[58] Field of Search ............... 118/100, 106, 109, 110, 118/642; 427/259, 264, 369, 54.1; 156/583.3, 581, 537, 345, 659.1; 430/313, 314, 323, 326

[56] References Cited
U.S. PATENT DOCUMENTS

| | | | |
|---|---|---|---|
| 2,018,736 | 10/1935 | Norris | 156/583.3 X |
| 2,414,125 | 1/1947 | Rheinfrank, Jr. | 427/369 X |
| 4,546,065 | 10/1985 | Amendola et al. | 430/313 |

Primary Examiner—Michael G. Wityshyn
Attorney, Agent, or Firm—Stanley A. Marcus; Robert B. Henn

[57] ABSTRACT

An improvement in the preparation of printed circuits comprises inserting a deformable layer between the phototool or support layer, and the solder mask. The deformable layer provides a uniform, integral and relatively thin coating of solder mask over circuit components, and results in higher-quality solder joints and lower rejection rates for finished boards.

2 Claims, 2 Drawing Sheets

PRINTED-WIREBOARD PHOTOIMAGING

BACKGROUND OF THE INVENTION

1. Field of the Invention

This invention is in the field of methods and means for the production of printed-wireboard circuits. More particularly, the present invention is in the field of improvements in the application of coatings to printed wireboards (PWB), sometimes also referred to by the term "circuit board".

2. Description of the Prior Art

Photoimageable solder masks are generally coatings capable of selective polymerization by the application of energy, such as, e.g., radiation. Such masks are applied as manufacturing aids in the process used to solder electronic components to printed wireboards, and comprise two basic types: those applied by screen-printing imaging techniques, and those applied by photoimaging techniques. The photoimageable solder mask is applied to the PWB, and irradiated; sites where radiation impinges thereafter become relatively more or less polymerized or hardened, depending on particular polymer characteristics, and thus more or less resistant to removal by washing. The sites where the polymer remains are therefore selectively protected from the adherence of solder when the PWB is dipped in a bath or otherwise treated to apply solder to the PWB surface. The more common method is that of negative imaging, where the area to be coated is defined as the clear portion of the image, and the area not to be coated is dark; irradiation through this mask or phototool then causes hardening of the polymer in areas of exposure. In either case of a relatively higher or lower degree of polymerization, an image is produced in conformity with a predetermined pattern, generally an electrical or electronic circuit.

In one process, solder mask is applied to the PWB in two stages, the first stage being a non-imaging screen-printing application, and the second a transfer-coating process.

In the transfer-coating process particularly, the solder-mask transfer layer is applied to a support layer via non-imaging screen-printing simultaneously with a first-stage coating applied to the PWB. This support layer, described further hereinbelow, is transparent, and includes the phototool, or photographic image of the desired printed circuit or portions thereof, used for imaging.

The transfer is completed by first mating the support and transfer layer to the PWB via roller lamination, and then exposing the resulting structure to ultraviolet (UV) radiation. With this exposure, as noted hereinabove, the solder mask is selectively polymerized such that it reproduces the image on the phototool element of the support layer. The imaged portions of the solder mask adhere to the PWB as the support layer is removed.

The support layer includes a 0.013-millimeter (mm) thick poly(ethylene terephthalate) or equivalent dimensionally-stable film, laminated with a 0.013 mm adhesive layer to a standard 0.10 or 0.18 mm diazo phototool. While the film is flexible, it is virtually rigid in length and width, and necessarily not easily deformed by heat or mechanical action, in order to insure accuracy in the imaging process. Unfortunately, this rigidity does not allow the support layer to conform to the irregular topography of the PWB surface. The resulting coating, in areas where it is thereafter further treated to produce an image on the PWB or selectively to remove the solder mask, can then interfere with steps such as soldering components to the PWB, or can be too thick from the perspective of economically further treating the board.

SUMMARY OF THE INVENTION

The present invention comprises a deformable layer juxtaposed with a support layer to permit substantial conformation of a solder-mask layer with the topography of a circuit board prior to the step of photoimaging. The deformable layer comprises a structure having substantial dimensional stability in length and width, comcomitant with an ability to absorb variations in thickness.

DESCRIPTION OF THE PREFERRED EMBODIMENTS

The preferred embodiment of the present invention comprises a PWB imaging system having a phototool, a solder mask and a support layer with a deformable layer juxtaposed therewith. The deformable layer comprises a film having substantial dimensional stability in length and width, and a variable thickness as a function of pressure on the support layer, and the topography of the circuits on the PWB. Non-limiting examples of films useful in the practice of the present invention include, e.g., polyethylene amides, polyester urethanes, polyether urethanes, silicones, styrene-butadiene polymers, poly(ethylene-vinyl acetate) polyethylene, polypropylene and siliconized polyacrylates.

In one embodiment, the deformable layer is integral with the support layer; in another embodiment, the deformable layer consists of a container having a fluid contained therewithin. In a preferred embodiment, the container comprises an envelope with a viscous liquid in it.

In the method of the operation of this invention, there is described an improvement in the preparation of a printed circuit by the steps of applying a phototool and photoimageable solder mask to a printed-wire board, irradiating the solder mask through the phototool, removing unhardened solder mask and treating the board to apply solder to the surface, where the improvement comprises the use of a deformable layer to apply the solder mask.

Those skilled in the art will realize that the deformable layer of the present invention must be substantially transparent to UV radiation. This permits curing of the solder mask to be initiated by a UV source while the deformable layer is juxtaposed between the phototool and the PWB.

This invention provides a support layer to deliver thinner, more uniform solder-mask coatings by the inclusion of a dampening element between the phototool and the transfer layer, wherein the dampening layer provides pliability or deformability which is not attainable with the support layers of the prior art, and improves conformity of the coating to the PWB design topography. The addition of the dampening element, or deformable layer, to the support layer permits the delivery of a coating which conforms more closely to the topography of the PWB surface than does the necessarily somewhat rigid phototool of the prior art.

Figure 1:
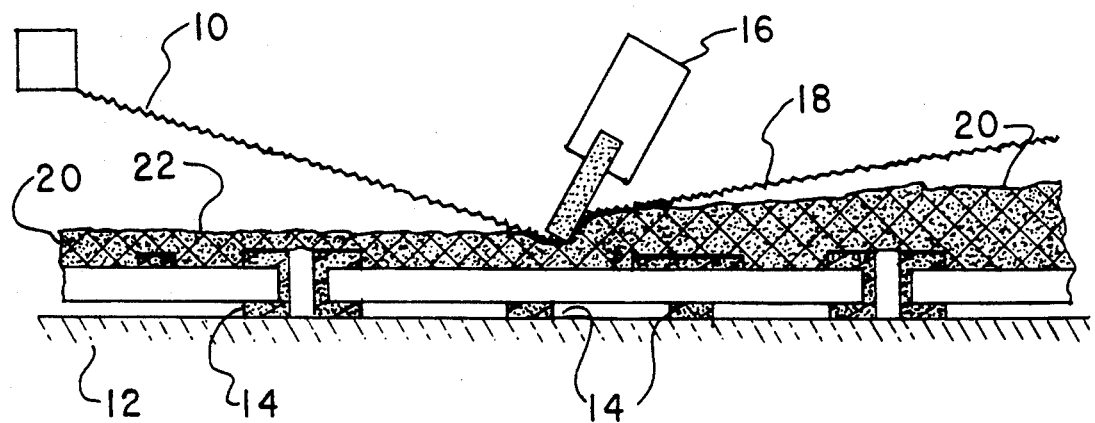
FIG. 1 shows a solder-mask application system of the prior art.

Turning now to the drawings, FIG. 1 shows a portion of a solder-mask transfer system 10 of the prior art, where PWB 12 has circuit portions 14 affixed thereto. Applicator 16 serves to apply pressure through support layer 18 to solder mask 20. Applicator 16 is shown here as a squeegee blade, but can be any suitable means for the application of pressure, including, without limitation herein, a roller, sponge or the like.

Support layer 18 is generally a film with high dimensional stability such as, e.g., poly(ethylene) terephthalate, high-density polypropylene or the like. The effect of applying pressure to the solder mask 20 by the method of the prior art is shown as providing a substantially level coating of the mask material over the board 12 and the circuit portions 14. On subsequent treatment, such as selectively to remove portions of the solder mask 20 in order thereafter to solder connectors onto the PWB, the relatively large amounts 22 of solder mask 20 remaining make that operation inadequately reliable for acceptable quality. For instance, the amount of solder mask remaining at a particular site after imaging and selective removal can interfere with the physical step of soldering a component to the PWB, result in a starved joint, or leave trapped pockets of flux; each of these conditions can, individually or collectively, cause the failure and rejection of the entire board. Ideally, the amount of solder mask to protect a component is only that which will cover the area to be protected, without excess volume; therefore, within those parameters, the thinner the covering, the more economical the entire operation.

Figure 2:
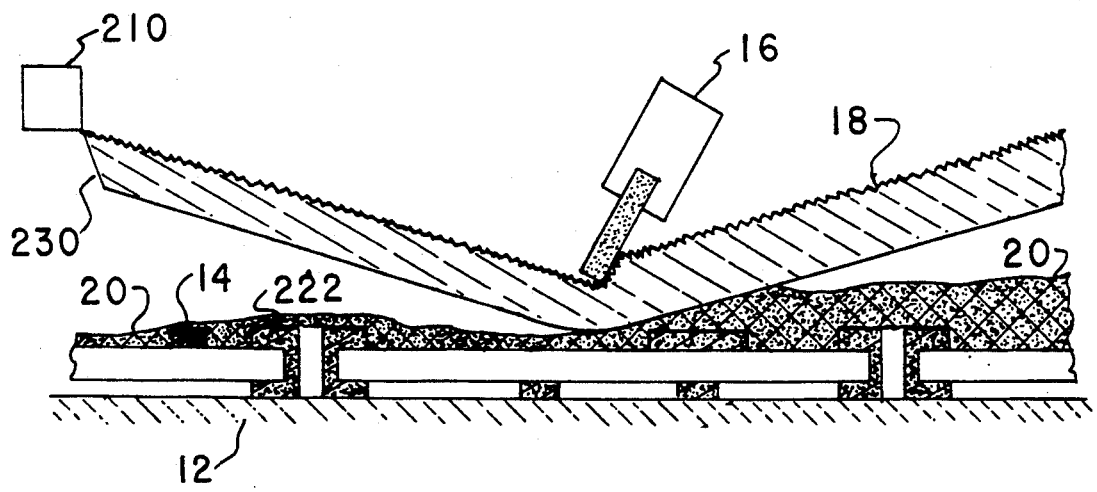
FIG. 2 shows the improved application system of this invention.

FIG. 2 shows the device 210 of the present invention. As set forth hereinabove in the description of the prior art, PWB 12 has circuit portions 14 affixed thereto. Applicator 16 serves to apply pressure by contact with, and cooperation through, support layer 18 to solder mask 20. Applicator 16 is shown here as a squeegee blade, but can be any suitable means for the application of pressure, including, without limitation herein, a roller, sponge or the like. Support layer 18 is generally a film with high dimensional stability such as, e.g., poly(ethylene) terephthalate, high-density polypropylene or the like.

Deformable layer 230 is shown in FIG. 2 as being attached to support layer 18, and bearing upon solder mask 20 in a fashion similar to that shown in FIG. 1. However, it has been surprisingly discovered that because of the deformability of layer 230, the distribution of the solder-mask material 20 on PWB 12 tends to be more even across that board, and while relatively thin over circuit portions 14, is nevertheless sufficiently thick to perform its protective function during subsequent operations, when some portions are removed in order to permit affixing of various electronic components, not shown here, but well known to those skilled in the art, and forming no part of this invention as such.

However, as noted hereinabove, that very fact of a relatively thin coat 222 of solder mask 20 is advantageous in requiring less time in removing solder mask where necessary, and of affording more reliable connection of additional components to the circuit portions 14 thus exposed.

Figure 3:
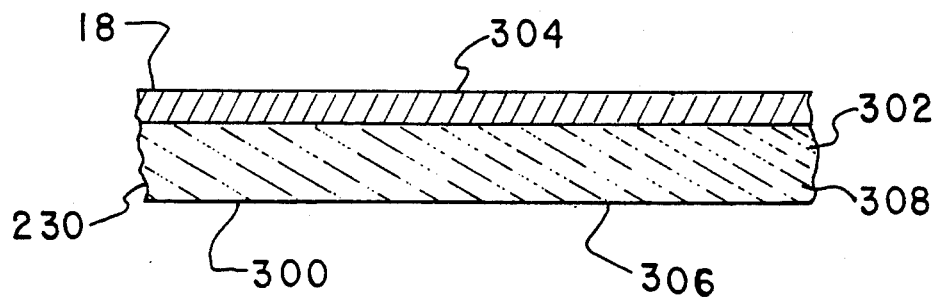
FIG. 3 is a view in section of the deformable layer of the present invention in the production of a PWB.

The deformable layer 230 of the present invention is shown in more detail in FIG. 3, with support layer 18 being affixed to deformable layer 230 as a separate structure with interface 302 interposed therebetween. However, it has been determined that layer 230 can be formed as a unitary layer defined by surfaces 304 and 306, the only mechanical requirement for both surfaces being that they be sufficiently strong to withstand the forces generated during the application of pressure by applicator 16, and the further requirement for surface 306 that it be sufficiently flexible to achieve the substantial conformance of the solder mask 20 with the topography of circuit portions 14.

The flexibility to achieve leveling of the solder mask 20 requires substantial deformability in the vertical component of the force applied by 16, concomitant with substantial dimensional stability in the horizontal dimensions, although complete inflexibility in the horizontal is not a necessity for the utility of this invention. Irrespective of the mechanical properties of the components of layer 230, the entire structure must be substantially transparent to the radiation used in the imaging process, generally UV, as noted hereinabove.

One embodiment of the present invention comprises a deformable layer consisting of a container 300 defined by the surfaces 302 or 304 and 306 and having a liquid contained therewithin, all components being substantially transparent to the energy employed for imaging, generally UV radiation, and necessarily stable to such energy or radiation. Non-limiting examples of suitable liquids include, e.g., aliphatic and cycloaliphatic mono- and polyhydric alcohols, water, and solutions or mixtures thereof, and mixtures or solutions of non-hydroxyl-containing organic liquids and inorganic liquids. The criteria for the contained liquid mixture or solution are that it be fluid at the temperatures used in the transfer process, not inimical to the material used as the container 300, and either have a refractive index substantially identical with that of the containment surfaces, or of such value that the refractive index of the entire container 300 is substantially identical with that of support layer 18. The liquid may comprise a gel, where the term "gel", as used herein, includes semisolid materials and highly viscous liquids such as greases, inverse emulsions and polymeric materials, and comprehends a fluid material which may substantially maintain its shape in the absence of external support; examples of gels useful in the present invention include, without limitation herein, petroleum jelly, thixotropic aqueous solutions, mixtures of hydrocarbon oils with metal salts of organic acids, silicone fluids, xanthan gum, and fluids, termed electrotropic, which are responsive to electrical charges to maintain a chosen or desired viscosity.

The contained liquid or liquid mixture is preferably chosen to match as closely as possible the refractive index of the liquid 308 with that of the surfaces 302, 304 and 306, or any of them at the wavelength of radiation used in the imaging process. This criterion assures minimal refraction of the incident radiation, and therefore optimum fidelity of the developed image to the original in the course of processing the PWB.

Figure 4:
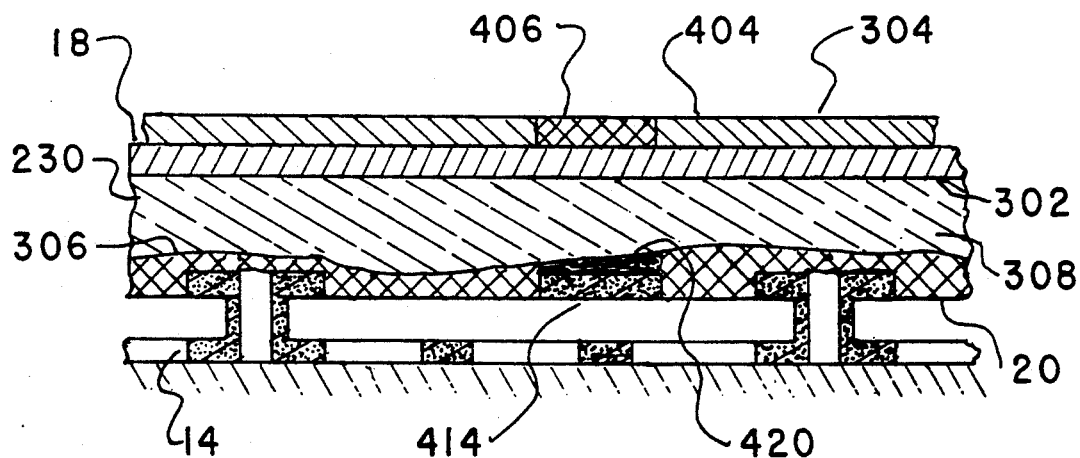
FIG. 4 shows another embodiment of the invention with the phototool and the support layer being integral.

FIG. 4 shows another embodiment of the present invention, where support layer 18 serves also as a phototool 402, and carries an image indicated as clear or transparent portions 404 and dark or opaque portions 406. Opaque portions 406 are in register over circuit portions 14 to which solder connection will be made later in the processing of the PWB to form a component of an electronic device. Phototool 402 has been placed over PWB 12, and pressure applied as described hereinabove, with the difference that support layer 18 and integral deformable layer 230 have remained in contact with solder mask 20. With the components in place as shown in FIG. 4, the system is exposed to UV radiation, with the result that the solder mask 20 immediately juxtaposed over circuit portion 414 is hardened. After exposure, phototool 402 is removed.

Upon subsequent treatment by means well known to those skilled in the art and which form no part of this invention as such, the solder mask 20 is removed, and hardened portion 420 remains as a protective cover on circuit portion 414. When solder is applied to PWB 12, the solder adheres to exposed parts, but circuit portion 414 remains uncoated. In this fashion, a PWB circuit can be engineered to perform various desired functions.

PWB circuits prepared with the present invention are capable of significantly lower reject rates than those prepared by methods of the prior art. Further, solder joints on PWBs treated by the present invention can provide better joints generally, with comparatively little solder starvation and lower inclusion rates of flux and waste solder mask. The utility of the present invention arises from its efficacy in providing a thorough solder mask which is nevertheless thinner than those found generally in the prior art. On removal of unexposed solder mask, it is found that less time and material are required for the removal operation, and, as noted herein, the quality of solder joints effected on later treatment is generally superior to that of the prior art.

Modifications and improvements to the preferred forms of the invention disclosed and described herein may occur to those skilled in the art who come to understand the principles and precepts thereof. Accordingly, the scope of the patent to be issued hereon should not be limited to the particular embodiments of the invention set forth herein, but rather should be limited only by the advance by which the invention has promoted the art.

What is claimed is:

1. In apparatus for treating a printed wireboard with a solder mask, the board having circuit portions with a design topography disposed thereon, and the apparatus comprising an applicator and a support layer, the improvement which comprises a deformable layer with a plurality of surfaces with a substantial vertical deformability in at least one surface, wherein the deformable layer is substantially transparent to ultraviolet radiation.

2. The apparatus of claim 1 wherein the deformable layer comprises a container having a liquid disposed therewithin, the liquid and the surfaces having substantially equal indices of refraction in the region of ultraviolet radiation used for imaging.

* * * * *